(12) United States Patent
Chou et al.

(10) Patent No.: US 9,230,895 B2
(45) Date of Patent: *Jan. 5, 2016

(54) PACKAGE SUBSTRATE AND FABRICATION METHOD THEREOF

(75) Inventors: Pao-Hung Chou, Taoyuan (TW); Hsien-Min Chang, Taoyuan (TW)

(73) Assignee: Unimicron Technology Corporation, Taoyuan (TW)

(*) Notice: Subject to any disclaimer, the term of this patent is extended or adjusted under 35 U.S.C. 154(b) by 520 days.

This patent is subject to a terminal disclaimer.

(21) Appl. No.: 13/191,807

(22) Filed: Jul. 27, 2011

(65) Prior Publication Data

US 2012/0097429 A1    Apr. 26, 2012

(30) Foreign Application Priority Data

Oct. 26, 2010 (TW) .................. 99136401 A

(51) Int. Cl.

| | |
|---|---|
| *H01L 23/498* | (2006.01) |
| *H05K 3/00* | (2006.01) |
| *H05K 3/10* | (2006.01) |
| *C25D 5/02* | (2006.01) |
| *C25D 7/12* | (2006.01) |

(Continued)

(52) U.S. Cl.

CPC ........ *H01L 23/49811* (2013.01); *H05K 3/0097* (2013.01); *H05K 3/107* (2013.01); *C25D 5/02* (2013.01); *C25D 7/12* (2013.01); *H01L 21/4853* (2013.01); *H01L 23/3128* (2013.01); *H01L 24/48* (2013.01); *H01L 2224/48091* (2013.01); *H01L 2224/48105* (2013.01); *H01L 2224/48245* (2013.01); *H01L 2224/48247* (2013.01); *H05K 1/111* (2013.01); *H05K 3/282* (2013.01); *H05K 2201/0376* (2013.01); *H05K 2203/1536* (2013.01)

(58) Field of Classification Search

CPC .................................. C25D 5/02; C25D 7/12
USPC ..................................................... 205/78, 125
See application file for complete search history.

(56) References Cited

U.S. PATENT DOCUMENTS 5,097,393 A * 3/1992 Nelson et al. .................. 361/794
5,897,334 A    4/1999 Ha et al.

(Continued)

FOREIGN PATENT DOCUMENTS

| CN | 101192542 | 6/2008 |
| CN | 101346038 | 1/2009 |

(Continued)

*Primary Examiner* — Luan Van
*Assistant Examiner* — Louis Rufo
(74) *Attorney, Agent, or Firm* — Mintz Levin Cohn Ferris Glovsky and Popeo, P.C.; Peter F. Corless; Steven M. Jensen

(57) ABSTRACT

A package substrate includes: a dielectric layer having two opposite surfaces; a wiring layer embedded in the dielectric layer and exposed from the two opposite surfaces of the dielectric layer, wherein the wiring layer has solder pads, conductive pads and circuit wires electrically connecting the solder pads and the conductive pads; and a first insulating protection layer disposed on one of the two opposite surfaces of the dielectric layer to cover the dielectric layer and the wiring layer and having a plurality of openings for exposing the conductive pads, respectively. The package substrate, by directly using the dielectric layer as a base, provides a package substrate having reduced thickness and lower fabrication costs compared to the prior art.

3 Claims, 8 Drawing Sheets

(51) Int. Cl.
   *H01L 21/48* (2006.01)
   *H01L 23/00* (2006.01)
   *H01L 23/31* (2006.01)
   *H05K 1/11* (2006.01)
   *H05K 3/28* (2006.01)

(56) References Cited

U.S. PATENT DOCUMENTS

| 8,227,711 | B2 * | 7/2012 | Hsu | 174/263 |
| 2004/0089936 | A1 | 5/2004 | Shizuno | |
| 2006/0024862 | A1 | 2/2006 | Takakusaki et al. | |
| 2006/0231288 | A1 | 10/2006 | Vanfleteren et al. | |
| 2007/0017815 | A1 * | 1/2007 | Wang et al. | 205/125 |
| 2009/0083976 | A1 * | 4/2009 | Lee | 29/846 |
| 2010/0140100 | A1 * | 6/2010 | Kim et al. | 205/125 |
| 2011/0042128 | A1 * | 2/2011 | Hsu | 174/257 |

FOREIGN PATENT DOCUMENTS

| CN | 101657074 | 2/2010 |
| JP | 11-145590 | 5/1999 |
| JP | 2009-32918 | 2/2009 |
| TW | 201010560 | 3/2010 |
| TW | 201029135 | 8/2010 |

* cited by examiner

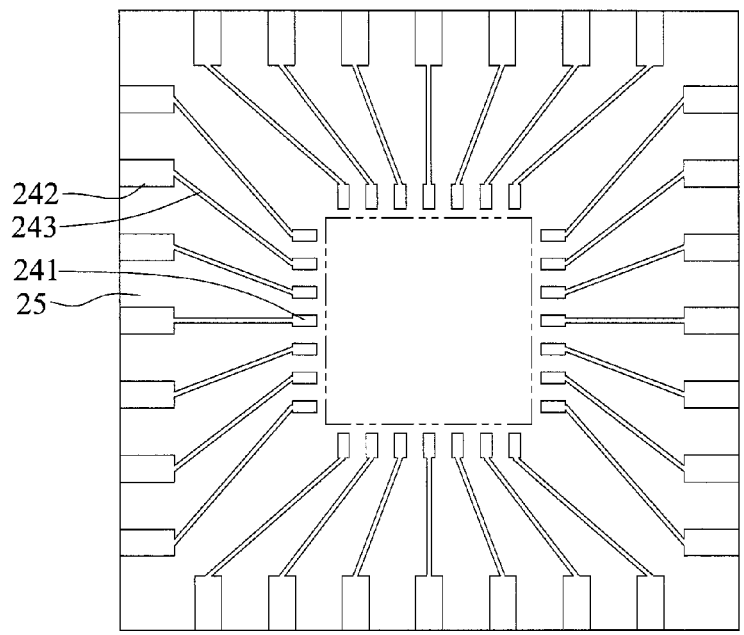
FIG. 2H'
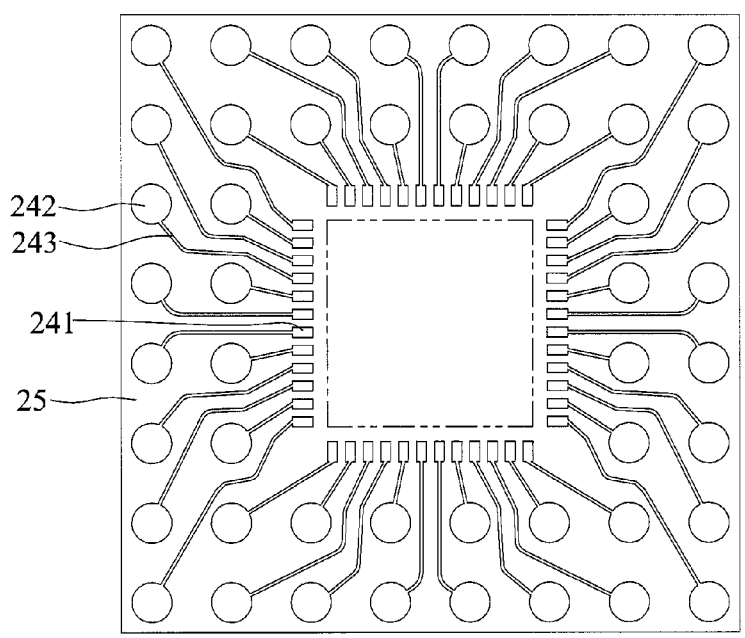
FIG. 2H"

PACKAGE SUBSTRATE AND FABRICATION METHOD THEREOF

CROSS-REFERENCES TO RELATED APPLICATIONS

This application claims under 35 U.S.C. §119(a) the benefit of Taiwanese Application No. 099136401, filed Oct. 26, 2010, the entire contents of which is incorporated herein by reference.

BACKGROUND OF THE INVENTION

1. Field of the Invention

The present invention relates generally to package substrates and fabrication methods thereof, and more particularly, to a package substrate with a single wiring layer and a fabrication method thereof.

2. Description of Related Art

Lead frame package substrates have long been used due to their low fabrication cost and high reliability. In particular, lead frame package substrates are cost-competitive for semiconductor chips with low I/O counts.

In some cases, package substrates for simple electronic products only need a single wiring layer.

FIGS. 1A to 1G are cross-sectional views showing a package substrate having a single wiring layer and a fabrication method thereof.

Referring to FIG. 1A, a carrier board 10 is provided, which has two opposite surfaces each having a copper layer 11 disposed thereon.

Referring to FIG. 1B, a resist layer 12 is formed on one of the copper layers 11 and a plurality of openings 120 is formed in the resist layer 12 to expose portions of the copper layer 11.

Referring to FIG. 1C, the exposed portions of the copper layer 11 are removed so as to form a wiring layer 111 on the carrier board 10.

Referring to FIG. 1D, the resist layer 12 is removed.

Referring to FIG. 1E, a plurality of through holes 100 is formed in the carrier board 10 by a laser, each penetrating to the wiring layer 111 at one end thereof.

Referring to FIG. 1F, a first insulating protection layer 13 is formed on one surface of the carrier board 10 with the wiring layer 111, and a plurality of openings 130 is formed in the first insulating protection layer 13 for exposing portions of the wiring layer 111; and a second insulating protection layer 14 is formed on the other surface of the carrier board 10 and a plurality of openings 140 is formed in the second insulating protection layer 14 to expose the through holes 100.

Referring to FIG. 1G, a surface-processing layer 15 is formed on the exposed surface of the wiring layer 111 so as for mounting of solder balls (not shown).

Since the package substrate comprises the carrier board for supporting the wiring layer, the package substrate has a thickness of about 130 μm, which is close to the thickness of a package substrate with double wiring layers, thereby adversely affecting the miniaturization of electronic products.

Therefore, it is desired to provide a package substrate and a fabrication method that overcomes the above-described drawback.

SUMMARY OF THE INVENTION

Accordingly, the present invention provides a package substrate with a reduced thickness and a fabrication method thereof.

In order to achieve the above and other objectives, the present invention provides a package substrate, which comprises: a dielectric layer having two opposite surfaces; a wiring layer embedded in the dielectric layer and exposed from the two opposite surfaces of the dielectric layer, wherein the wiring layer comprises solder pads, conductive pads, and circuit wires electrically connecting the solder pads and the conductive pads; and a first insulating protection layer formed on one of the two opposite surfaces of the dielectric layer to cover the dielectric layer and the wiring layer and having a plurality of first openings for exposing the conductive pads, respectively.

In an embodiment, a surface-processing layer is disposed on an exposed surface of the wiring layer.

In an embodiment, the above-described package substrate further comprises a second insulating protection layer disposed on the other surface of the dielectric layer to cover the dielectric layer and the wiring layer and having a plurality of second openings for exposing the solder pads, respectively. Furthermore, a surface-processing layer can be disposed on exposed surfaces of the solder pads and the conductive pads.

The present invention provides another package substrate, which comprises: a dielectric layer having two opposite surfaces; and a wiring layer embedded in the dielectric layer and comprising solder pads, conductive pads, and circuit wires electrically connecting the solder pads and the conductive pads, wherein the wiring layer is exposed from one of the two opposite surfaces of the dielectric layer and the other surface of the dielectric layer has a plurality of first openings for exposing the conductive pads, respectively.

In an embodiment, a surface-processing layer is disposed on the exposed surfaces of the wiring layer.

In an embodiment, the above-described package substrate further comprises an insulating protection layer disposed on the surface of the dielectric layer with the exposed wiring layer and having a plurality of second openings for exposing the solder pads, respectively. Furthermore, a surface-processing layer can be disposed on an exposed surface of the solder pads and the conductive pads.

In an embodiment, the dielectric layer is made of a solder resist layer or an epoxy resin.

The present invention further provides a fabrication method of a package substrate, which comprises the steps of: providing a carrier board having two opposite surfaces each having a first metal layer and a second metal layer sequentially disposed thereon; forming a wiring layer on each of the second metal layers by electroplating, wherein the wiring layer comprises solder pads, conductive pads, and circuit wires electrically connecting the solder pads and the conductive pads; forming dielectric layers on the second metal layers and the wiring layers; removing portions of the dielectric layers on the wiring layers so as to expose one surface of the wiring layers; removing the carrier board and the first metal layers; removing the second metal layers so as to expose the other surfaces of the wiring layers; and forming on one surface of each of the dielectric layers a first insulating protection layer to cover the dielectric layer and the corresponding wiring layer, and forming a plurality of first openings in the first insulating protection layer for exposing the conductive pads, respectively.

In an embodiment, the portions of the dielectric layers on the wiring layers are removed by grinding so as to cause the dielectric layers to be flush with the wiring layers, respectively.

In an embodiment, the method further comprises the step of forming a surface-processing layer on an exposed surface of each of the wiring layers.

In an embodiment, the method further comprises the step of forming on the other surface of each of the dielectric layers a second insulating protection layer to cover the dielectric layer and the corresponding wiring layer, and forming a plurality of second openings in the second insulating protection layer for exposing the solder pads, respectively. The method can further comprise the step of forming a surface-processing layer on exposed surfaces of the solder pads and conductive pads.

The present invention further provides another fabrication method of a package substrate, which comprises the steps of: providing a carrier board having two opposite surfaces each having a first metal layer and a second metal layer sequentially disposed thereon; forming a wiring layer on each of the second metal layers by electroplating, wherein the wiring layer comprises solder pads, conductive pads, and circuit wires electrically connecting the solder pads and the conductive pads; forming dielectric layers on the second metal layers and the wiring layers; forming a plurality of first openings in each of the dielectric layers for exposing the conductive pads, respectively; removing the carrier board and the first metal layers; and removing the second metal layers to expose the wiring layers.

In an embodiment, the method further comprises the step of forming a surface-processing layer on an exposed surface of each of the wiring layers.

In the above-described method, the openings can be formed by laser ablation, or exposure and development, and the dielectric layers can be made of a solder resist layer or an epoxy resin.

The above-described method can further comprise the step of forming an insulating protection layer on one surface of each of the dielectric layers with the exposed wiring layer, and forming a plurality of second openings in the insulating protection layer for exposing the solder pads, respectively. Furthermore, the method can comprise the step of forming a surface-processing layer on exposed surfaces of the solder pads and conductive pads.

Therefore, the present invention uses a dielectric layer as a base to provide a package substrate with a single wiring layer. Since the dielectric layer and the wiring layer are combined in a same layer, the overall thickness of the package substrate is greatly reduced, thereby meeting the miniaturization demands of electronic products. Further, the present invention can fabricate two package substrates in a single process and the carrier board between the package substrates can be repeatedly used to reduce fabrication costs.

BRIEF DESCRIPTION OF DRAWINGS

FIGS. 3A to 3D are cross-sectional views showing a package substrate and a fabrication method thereof according to a second embodiment of the present invention, wherein FIGS. 3C-2 and 3D-2 are different embodiments of FIGS. 3C-1 and 3D-1, respectively, and FIGS. 3D'-1 and 3D'-2 are different embodiments of FIGS. 3D-1 and 3D-2, respectively.

DETAILED DESCRIPTION OF PREFERRED EMBODIMENTS

The following illustrative embodiments are provided to illustrate the disclosure of the present invention, these and other advantages and effects being apparent to those in the art after reading this specification.

First Embodiment

Figure 1A:
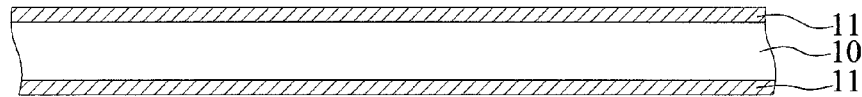
FIGS. 1A to 1G are cross-sectional views showing a conventional package substrate having a single wiring layer and a fabrication method thereof.
Figure 1B:
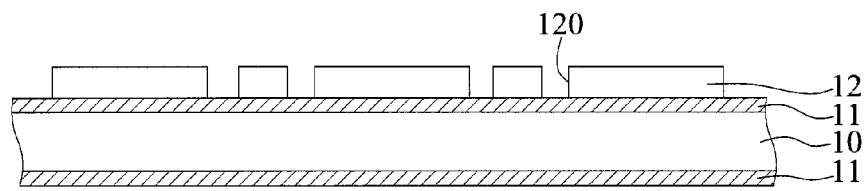
Figure 1C:
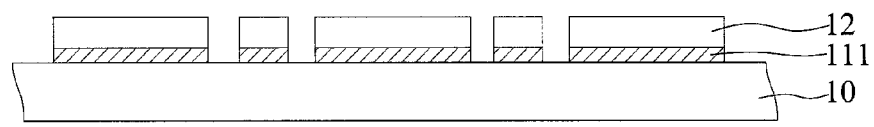
Figure 1D:
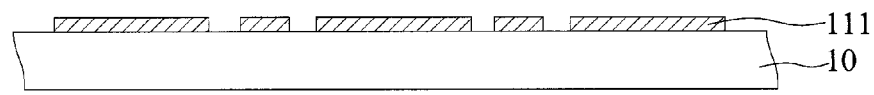
Figure 1E:
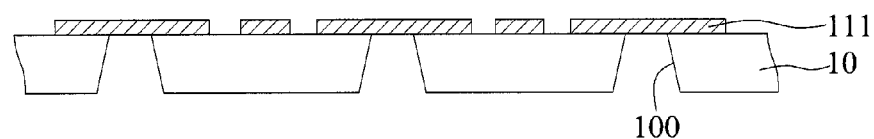
Figure 1F:
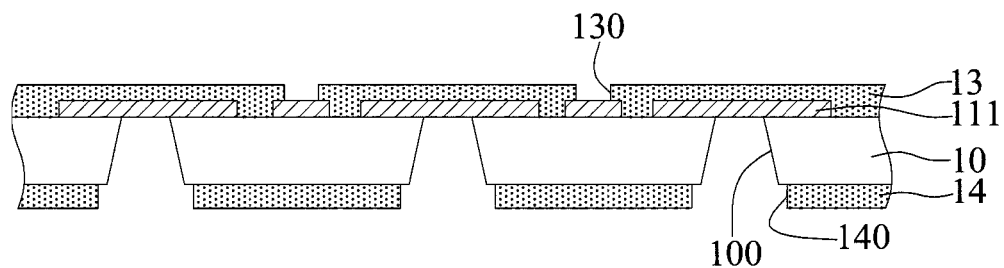
Figure 1G:
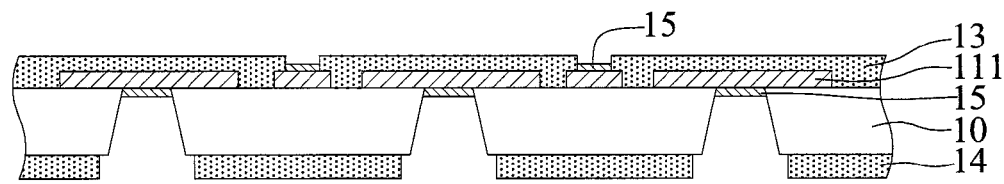
Figure 2A:
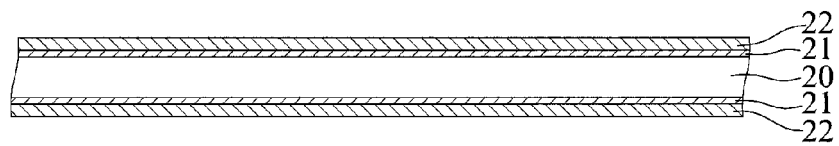
FIGS. 2A to 2J are cross-sectional and top views showing a package substrate and a fabrication method thereof according to a first embodiment of the present invention, wherein FIGS. 2H' and 2H" are top views showing different embodiments of FIG. 2H, and FIGS. 2I' and 2J' are top views of different embodiments of FIGS. 2I and 2J, respectively.
Figure 2B:
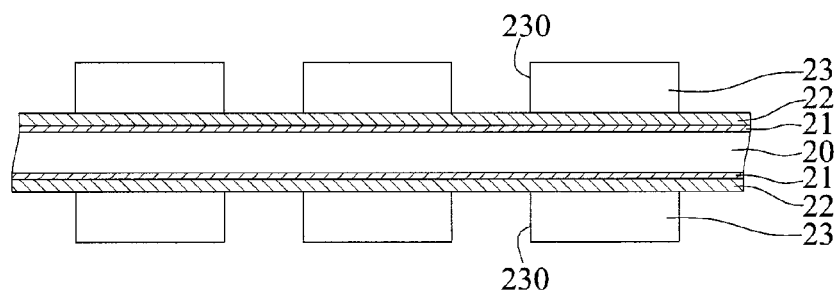
Figure 2C:
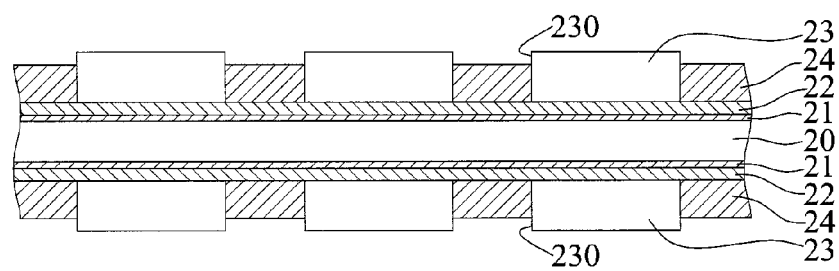
Figure 2D:
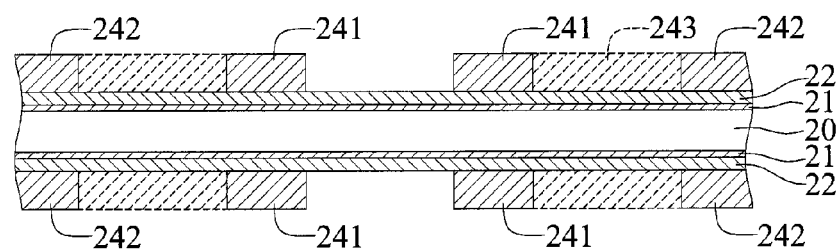
Figure 2E:
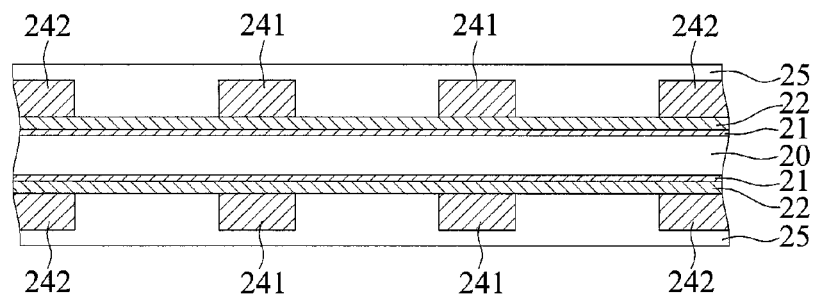
Figure 2F:
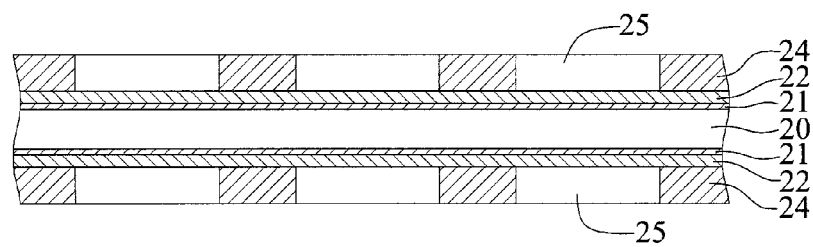
Figure 2G:
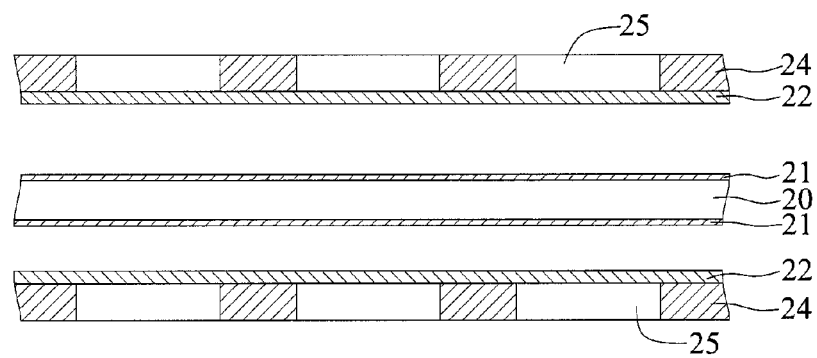
Figure 2H:
Figure 2I:
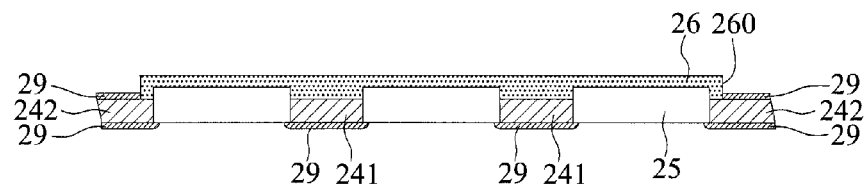
Figure 2I:
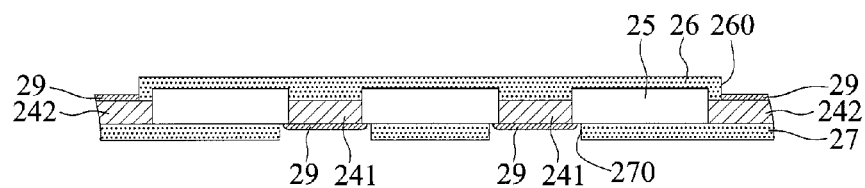
Figure 2J:
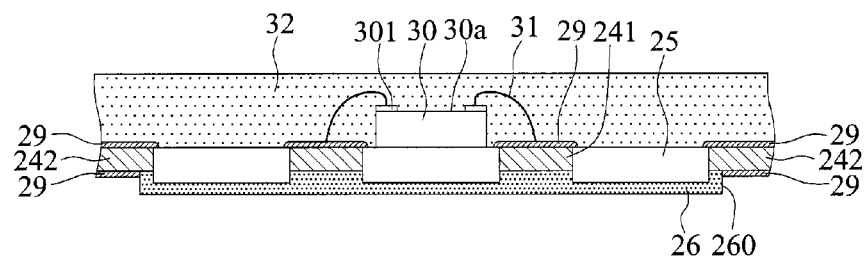
Figure 2J:
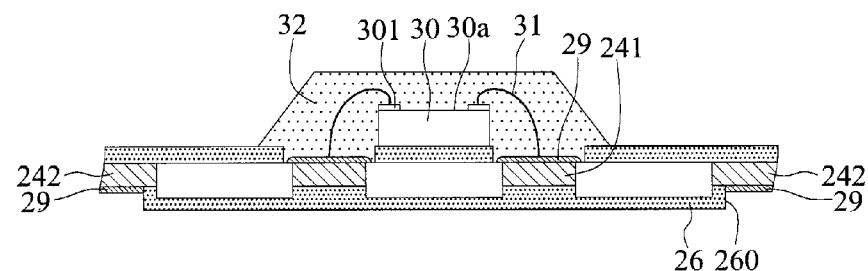

FIGS. 2A to 2J are cross-sectional and top views showing a package substrate and a fabrication method thereof according to a first embodiment of the present invention, wherein FIGS. 2H' and 2H" are different embodiments of FIG. 2H, and FIGS. 2I' and 2J' are different embodiments of FIGS. 2I and 2J, respectively.

Referring to FIG. 2A, a carrier board 20 is provided, which has two opposite surfaces each having a first metal layer 21 and a second metal layer 22 sequentially disposed thereon.

Referring to FIG. 2B, a resist layer 23 is formed on each of the second metal layers 22 and a plurality of open areas 230 is formed in the resist layers 23 for exposing portions of the second metal layers 22.

Referring to FIG. 2C, wiring layers 24 are formed in the open areas 230.

Referring to FIG. 2D, the resist layers 23 are removed, and each of the wiring layers 24 comprises solder pads 241, conductive pads 242 and circuit wires 243 electrically connecting the solder pads 241 and the conductive pads 242.

Referring to FIG. 2E, dielectric layers 25 are formed on the second metal layers 22 and the wiring layers 24.

Referring to FIG. 2F, portions of the dielectric layers 25 are removed to expose one surface of the wiring layers 24. In an embodiment, the portions of the dielectric layers 25 can be removed by grinding so as to cause the dielectric layers 25 to be flush with the corresponding wiring layers 24, respectively.

Referring to FIG. 2G, the carrier board 20 and the first metal layers 21 are removed.

Referring to FIG. 2H, the second metal layers 22 are removed to expose the other surfaces of the wiring layers 24.

FIGS. 2H' and 2H" are top views showing different embodiments of FIG. 2H. Referring to FIG. 2H', the conductive pads 242 are solder pads for a QFN (Quad Flat Non-leaded) package. Referring to FIG. 2H", the conductive pads 242 are solder ball pads for a BGA (Ball Grid Array) package.

Referring to FIG. 2I, a first insulating protection layer 26 is formed on one surface of the dielectric layer 25 so as to cover the dielectric layer 25 and the wiring layer 24, and a plurality of openings 260 is formed in the first insulating protection layer 26 to expose the conductive pads 242, respectively. Further, a surface-processing layer 29 is formed on the exposed surfaces of the wiring layer 24. Furthermore, referring to FIG. 2I', a second insulating protection layer 27 can be formed on the other surface of the dielectric layer 25 so as to cover the dielectric layer 25 and the wiring layer 24, and a plurality of openings 270 is formed in the second insulating protection layer 27 to expose the solder pads 241, respectively. In addition, a surface-processing layer 29 is formed on the exposed surfaces of the solder pads 241 and the conductive pads 242. The above-described surface-processing layer 29 can be made of Ni/Au or ENEPIG (electroless nickel/electroless palladium/immersion gold). Further, the surface-processing layer 29 of FIG. 2I' can be made of an OSP (organic solderability preservative) film.

FIGS. 2J and 2J' show example applications of the package substrates of FIGS. 2I and 2I', respectively. Referring to FIGS. 2J and 2J', a semiconductor chip 30 having an active surface 30a with a plurality of electrode pads 301 is disposed on a chip-mounting area of the package substrate, and the electrode pads 301 are electrically connected to the solder pads 241 through solder wires 31, and an encapsulant 32 is formed to encapsulate the semiconductor chip 30 and the solder wires 31 to form a package structure.

After the step of FIG. 2J or FIG. 2J', solder balls (not shown) can further be formed on the surface-processing layer 29 for electrically connecting an external electronic device such as a circuit board.

The present invention further provides a package substrate, which comprises: a dielectric layer 25 made of such as an epoxy resin; a wiring layer 24 embedded in the dielectric layer 25 and exposed from two opposite surfaces of the dielectric layer 25, wherein the wiring layer 24 comprises solder pads 241, conductive pads 242 and circuit wires 243 electrically connecting the solder pads 241 and the conductive pads 242; and a first insulating protection layer 26 disposed on one surface of the dielectric layer 25 to cover the dielectric layer 25 and the wiring layer 24 and having a plurality of openings 260 for exposing the conductive pads 242, respectively.

The package substrate can further comprise a surface-processing layer 29 disposed on the exposed surfaces of the wiring layer 24.

The package substrate can further comprise a second insulating protection layer 27 disposed on the other surface of the dielectric layer 25 to cover the dielectric layer 25 and the wiring layer 24 and having a plurality of openings 270 for exposing the solder pads 241, respectively. The package substrate further comprises a surface-processing layer 29 disposed on the exposed surfaces of the solder pads 241 and conductive pads 242.

Second Embodiment

Figure 3A:
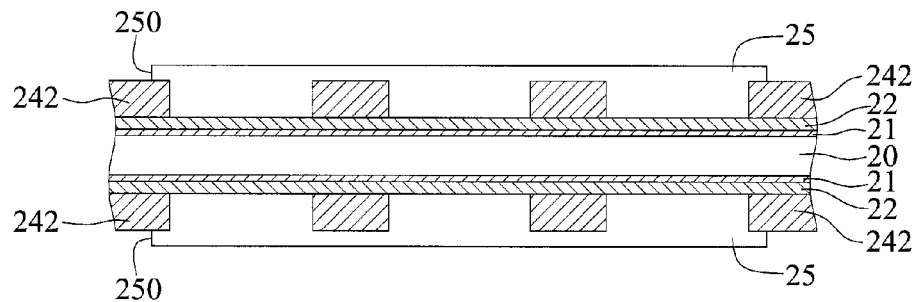
Figure 3B:
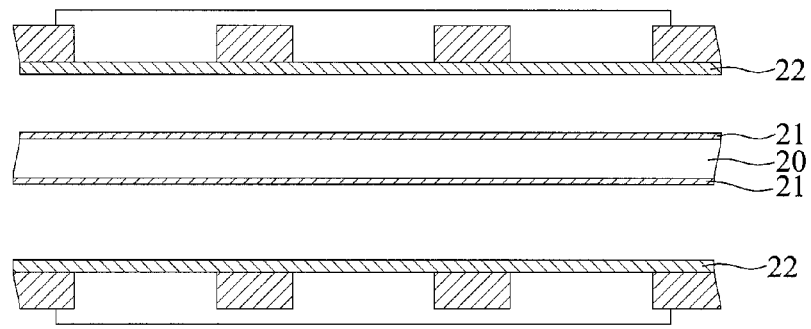
Figures 1, 3C:
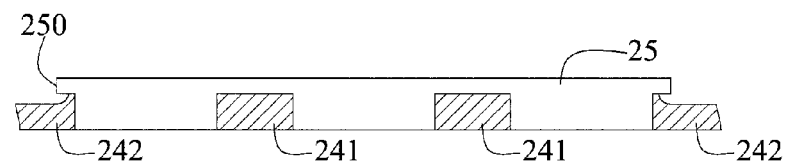
Figures 2, 3C:
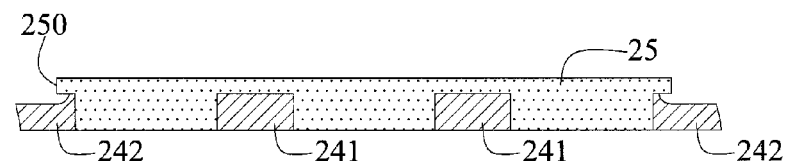
Figures 1, 3D:
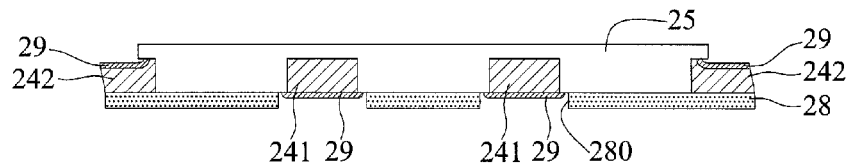
Figures 2, 3D:
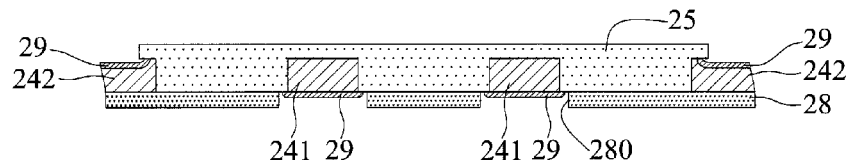
Figure 3D:
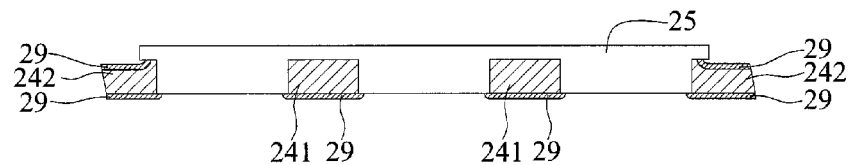
Figure 3D:
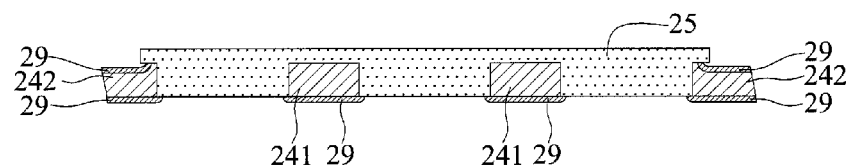

FIGS. 3A to 3D are cross-sectional views showing a package substrate and a fabrication method thereof according to a second embodiment of the present invention, wherein FIGS. 3C-2, 3D-2 are different embodiments of FIGS. 3C-1 and 3D-1, respectively, and FIGS. 3D'-1 and 3D'-2 are different embodiments of FIGS. 3D-1 and 3D-2, respectively.

Referring to FIG. 3A, which is continued from FIG. 2E, a plurality of openings 250 is formed in each of the dielectric layers 25 to expose the conductive pads 242 by laser ablation or exposure and development.

Referring to FIG. 3B, the carrier board 20 and the first metal layers 21 are removed.

Referring to FIG. 3C-1 or 3C-2, the second metal layers 22 are removed to expose the wiring layers, respectively.

Referring to FIG. 3D-1 or 3D-2, an insulating protection layer 28 is formed on one surface of the dielectric layer with the exposed wiring layer 241 so as to cover the dielectric layer 25 and the wiring layer 24; a plurality of openings 280 is formed in the insulating protection layer 28 to expose the solder pads 241, respectively; and a surface-processing layer 29 is formed on the exposed surfaces of the solder pads 241 and the conductive pads 242.

Alternatively, referring to FIGS. 3D'-1 or 3D'-2, a surface-processing layer 29 is formed on the exposed surfaces of the wiring layer 24. The surface-processing layer 29 can be made of Ni/Au or ENEPIG.

The above-described dielectric layer 25 can be made of an epoxy resin, as shown in FIGS. 3C-1, 3D-1 and 3D'-1, or made of a solder resist material, as shown in FIGS. 3C-2, 3D-2 and 3D'-2.

The present invention further provides a package substrate, which comprises: a dielectric layer 25; and a wiring layer 24 embedded in the dielectric layer 25 and comprising solder pads 241, conductive pads 242 and circuit wires 243 electrically connecting the solder pads 241 and the conductive pads 242, wherein the wiring layer 24 is exposed from one surface of the dielectric layer 25 and the other surface of the dielectric layer 25 has a plurality of openings 250 for exposing the conductive pads 242, respectively.

The package substrate can further comprise a processing layer 29 disposed on the exposed surfaces of the wiring layer 24.

Alternatively, the package substrate can further comprise an insulating protection layer 28 disposed on the surface of the dielectric layer 25 with the exposed wiring layer 24 for covering the dielectric layer 25 and the wiring layer 24 and having a plurality of openings 280 for exposing the solder pads 241, respectively. Furthermore, the package substrate comprises a surface-processing layer 29 disposed on the exposed surfaces of the solder pads 241 and the conductive pads 242.

Therefore, the present invention uses a dielectric layer as a base to provide a package substrate with a single wiring layer. Since the dielectric layer and the wiring layer are combined in the same layer, the overall thickness of the package substrate is greatly reduced, thereby better facilitating the miniaturization of electronic products. Further, the present invention can fabricate two package substrates in a single process and the carrier board between the package substrates can be repeatedly used to reduce fabrication costs.

The above-described descriptions of the detailed embodiments are provided to illustrate the preferred implementation according to the present invention, and are not intended to limit the scope of the present invention. Accordingly, many modifications and variations completed by those with ordinary skill in the art will fall within the scope of present invention as defined by the appended claims.

What is claimed is:

1. A fabrication method of a plurality of single-wiring-layer package substrates, comprising the steps of:

providing a carrier board having two opposite surfaces each having a first metal layer and a second metal layer sequentially formed thereon;

forming a separate wiring layer on each of the second metal layers by electroplating, wherein each of the formed wiring layers comprises solder pads, conductive pads, and circuit wires electrically connecting the solder pads and the conductive pads;

forming dielectric layers on the second metal layers and the wiring layers;

removing portions of the dielectric layers on the wiring layers so as to expose one surface of each of the wiring layers;

removing the carrier board and the first metal layers;

removing the second metal layers so as to expose the other surfaces of the wiring layers;

after the carrier board, the first metal layers, and the second metal layers are removed, forming on one surface of each of the dielectric layers a first insulating protection layer to cover the dielectric layer and the corresponding wiring layer to form the plurality of single-wiring-layer package substrates, and forming a plurality of first openings in the first insulating protection layer for exposing the conductive pads, respectively; and forming on the other surface of each of the dielectric layers a second insulating protection layer to cover the dielectric layer and the corresponding wiring layer, and forming a plurality of second openings in the second insulating protection layer for exposing the solder pads, respectively.

2. The method of claim 1, wherein the portions of the dielectric layers on the wiring layers are removed by grinding so as to cause the dielectric layers to be flush with the wiring layers, respectively.

3. The method of claim 1, further comprising the step of forming a surface-processing layer on the exposed surfaces of each of the wiring layers.

* * * * *